(12) United States Patent  
Ozawa

(10) Patent No.: US 8,384,051 B2  
(45) Date of Patent: Feb. 26, 2013

(54) CHARGED PARTICLE BEAM DRAWING APPARATUS AND ARTICLE MANUFACTURING METHOD USING SAME

(75) Inventor: Kimitaka Ozawa, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/300,032

(22) Filed: Nov. 18, 2011

(65) Prior Publication Data

US 2012/0126138 A1    May 24, 2012

(30) Foreign Application Priority Data

Nov. 19, 2010   (JP) .................................. 2010-258550

(51) Int. Cl.
- *H01J 3/07* (2006.01)
- *H01J 3/14* (2006.01)
- *H01J 3/26* (2006.01)
- *G03F 9/00* (2006.01)

(52) U.S. Cl. ............. 250/492.22; 250/492.2; 250/491.1; 250/396 R; 250/397

(58) Field of Classification Search .............. 250/396 R, 250/397, 492.22, 492.2, 491.1
See application file for complete search history.

(56) References Cited

U.S. PATENT DOCUMENTS

| | | | |
|---|---|---|---|
| 2012/0178025 A1* | 7/2012 | Tanaka et al. | 430/296 |
| 2012/0228516 A1* | 9/2012 | Ozawa | 250/397 |

FOREIGN PATENT DOCUMENTS

| | | | |
|---|---|---|---|
| JP | 9007538 A | 1/1997 | |
| JP | 4058059 B2 | 3/2008 | |

* cited by examiner

*Primary Examiner* — Nikita Wells
(74) *Attorney, Agent, or Firm* — Rossi, Kimms & McDowell LLP

(57) ABSTRACT

The drawing apparatus of the present inventions includes a detector having a size for which the detector can simultaneously detect two adjacent charged particle beams among a plurality of charged particle beams, and configured to detect an intensity of a charged particle beam incident thereon. A controller is configured to perform a control of a position of the detector and a control of a blanking deflector array such that one of two adjacent charged particle beams is in a blanking state and the other is in a non-blanking state on the detector that is moved, and each of the plurality of charged particle beams becomes in a blanking state and a non-blanking state sequentially, to cause the detector to perform an output in parallel with the control, and to inspect a defect in each blanking deflector in the blanking deflector array based on the output.

8 Claims, 9 Drawing Sheets

CHARGED PARTICLE BEAM DRAWING APPARATUS AND ARTICLE MANUFACTURING METHOD USING SAME

BACKGROUND OF THE INVENTION

1. Field of the Invention

The present invention relates to a drawing apparatus that performs drawing on a substrate with a plurality of charged particle beams.

2. Description of the Related Art

In recent years, as micronization of the element, increasingly complex circuit patterns, or a higher capacity of pattern data advance, the drawing accuracy as well as drawing throughput of drawing apparatuses for use in the manufacturing of devices such as semiconductor integrated circuits needs to be improved. As a method for realizing that ideal, a multiple beam-type electron beam drawing apparatus is known in which a plurality of electron beams (charged particle beams) is deflected or the ON/OFF operation of the irradiation of electron beams is independently controlled so as to draw predetermined drawing data at the predetermined position of a substrate to be treated. Japanese Patent Laid-Open No. 9-7538 discloses a charged particle beam drawing apparatus that independently controls the ON/OFF operation of a plurality of electron beams using a blanking deflector (blanking deflector array).

Here, in the blanking deflector, a pair of electrodes are arranged so as to be facing an electron beam passing through each electron beam opening, where each of the electrodes is connected to a wire. At this time, voltage is applied between the electrodes and an electron beam is electrostatically deflected so as to be directed onto a stopping aperture, whereby the electron beam is turned OFF (subject to blanking). In other words, when a defect in an electrode or a disconnection of a wire occurs, voltage cannot be applied between the electrodes, and thus, an electron beam cannot be turned OFF. An opening where the irradiation of the electron beam is incapable of being turned OFF is referred to as a "white defect" of a blanking deflector. In contrast, an opening where the irradiation of the electron beam is incapable of being turned ON in a complete way due to the adhesion of dust on the opening is referred to as a "black defect". Furthermore, an opening where the irradiation of the electron beam is capable of being turned ON only in an incomplete way is referred to as a "gray defect". It should be noted that a black defect and a gray defect may occur not only due to the blanking deflector but also due to the adhesion of dust on the openings of, for example, an aperture array, an electrostatic lens, a blanking aperture, other deflector, or the like or a disconnection of a wire. The occurrence probability of such a defect in the blanking deflector tends to increase due to the micronization of electron beam or opening or the increase in the number of electron beams in association with the improvement in micronization of semiconductor integrated circuits or the improvement in productivity. Since the presence of such a defect prevents the electron beam drawing apparatus from drawing a pattern accurately, the position of a defect and the type thereof (white defect, black defect (gray defect)) need to be detected accurately at high speed.

Accordingly, Japanese Patent No. 4058059 discloses an electron beam current measuring method for detecting an anomaly of an electron beam in a multiple beam-type electron beam drawing apparatus. In the anomaly detection method, an electron beam(s) other than the specified position is firstly subject to blanking, and only the specified electron beam is irradiated to an electron beam detector. Next, electron beam current measurement is executed using a measurement parameter set to a value corresponding to measurement accuracy so as to judge whether an electron beam is normal or defective by comparing the measured value with a predetermined value.

Here, assume the case in which a defect (white defect, black defect, or gray defect) in a blanking deflector is detected using the anomaly detection method disclosed in Japanese Patent No. 4058059. Firstly, only an electron beam, of which the exposure dose is intended to be measured, is turned ON to be irradiated to an exposure dose measuring sensor for a predetermined time. At this time, when the measured exposure dose is as close to zero as possible, it is determined that a black defect occurs. In contrast, when the measured exposure dose does not reach a predetermined value, it is determined that a gray defect occurs, whereas, when the measured exposure reaches a predetermined value, it is determined that the blanking deflector is in a normal state or a white defect occurs. In this case, the electron beam is turned OFF and then irradiated to an exposure dose measuring sensor for a predetermined time. When the exposure dose at that time is equal to or greater than a predetermined value, it is determined that a white defect occurs, whereas, when the exposure dose is zero, it is determined that the blanking deflector is in a normal state. In general, in a multiple beam-type electron beam drawing apparatus, the number of electron beams is in the range of from several tens of thousands to several hundreds of thousands. Therefore, the implementation of the anomaly detection method described above to all electron beams needs a very large amount of time.

SUMMARY OF THE INVENTION

Accordingly, the present invention provides, for example, a drawing apparatus that is advantageous in terms of shortness in defect inspection time for a blanking deflector array.

According to an aspect of the present invention, A drawing apparatus that includes a blanking deflector array and performs drawing on a substrate with a plurality of charged particle beams passed through the blanking deflector array is provided that includes a detector having a size for which the detector can simultaneously detect two adjacent charged particle beams among the plurality of charged particle beams, and configured to detect an intensity of a charged particle beam incident thereon; and a controller, wherein the controller is configured to perform a control of a position of the detector and a control of the blanking deflector array such that one of two adjacent charged particle beams is in a blanking state and the other is in a non-blanking state on the detector that is moved, and each of the plurality of charged particle beams becomes in a blanking state and a non-blanking state sequentially, to cause the detector to perform an output in parallel with the control, and to inspect a defect in each blanking deflector in the blanking deflector array based on the output.

According to the present invention, for example, a drawing apparatus may be provided, that is advantageous in terms of shortness in defect inspection time for a blanking deflector array.

Further features of the present invention will become apparent from the following description of exemplary embodiments with reference to the attached drawings.

DESCRIPTION OF THE EMBODIMENTS

First Embodiment

Figure 1:
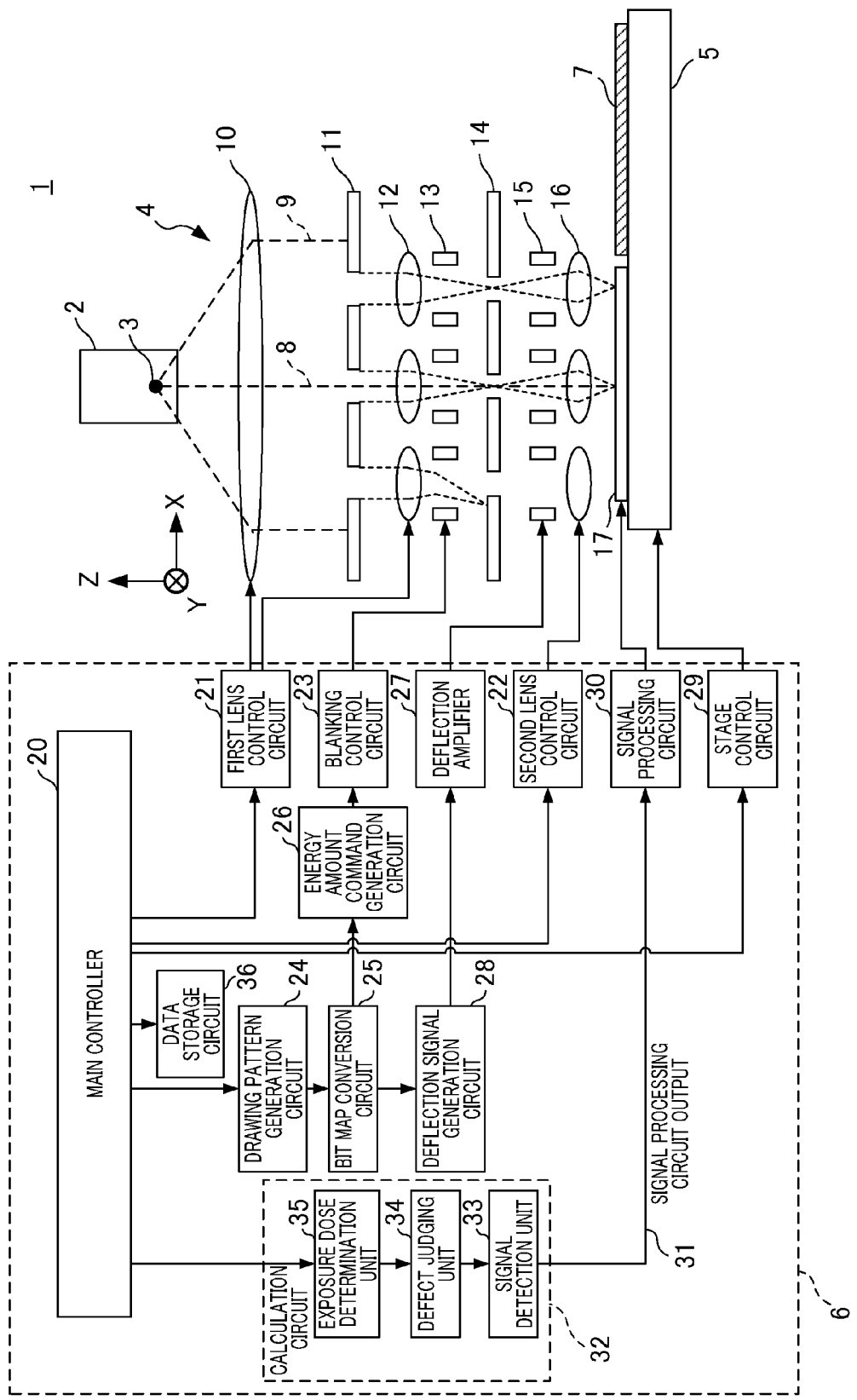
FIG. 1 is a diagram illustrating the configuration of a charged particle beam drawing apparatus according to an embodiment of the present invention.

Firstly, a description will be given of a charged particle beam drawing apparatus (hereinafter referred to simply as "drawing apparatus") according to a first embodiment of the present invention. Hereinafter, each of the drawing apparatuses to be described in the following embodiments is intended to employ a multiple beam system in which a plurality of electron beams is deflected and the ON/OFF operation of the irradiation of electron beams is independently controlled so as to draw predetermined drawing data on the predetermined position of a substrate to be treated (substrate to be exposed). Here, a charged particle beam of the present embodiment is not limited to an electron beam, but may be another charged particle beam such as an ion beam. FIG. 1 is a diagram illustrating the configuration of a drawing apparatus according to the present embodiment. Also, in the following drawings, a description will be given in which the Z axis is in an irradiation direction of an electron beam to a substrate to be treated, and the X axis and the Y axis are mutually oriented in directions orthogonal to a plane perpendicular to the Z axis. A drawing apparatus 1 includes an electron gun 2, an optical system 4 that splits an electron beam emitted from a crossover 3 of the electron gun 2 into a plurality of electron beams, and deflects and focuses the plurality of electron beams, a substrate stage 5 that holds a substrate to be treated, and a controller 6 that controls the operation of the components of the drawing apparatus 1. Note that an electron beam is readily attenuated under an atmosphere at normal pressure and is also discharged under high voltage. In order to prevent such phenomena, the components are installed in a vacuum chamber (not shown). In particular, the installation space of the electron gun 2 and the optical system 4 is held at a high vacuum. Also, a substrate (a substrate to be treated) 7 of the present embodiment is a wafer consisting of, for example, single crystal silicon. A photosensitive resist is coated on the surface of the substrate 7.

The electron gun 2 has a mechanism that emits an electron beam by applying heat or electric field. In FIG. 1, tracks 8 and 9 of an electron beam emitted from the crossover 3 are shown by dotted lines. The optical system 4 includes a collimator lens 10, an aperture array 11, a first electrostatic lens 12, a blanking deflector array 13, a blanking aperture 14, a deflector 15, and a second electrostatic lens 16 in the recited order from the electron gun 2 to the substrate stage 5. The collimator lens 10 is an optical element that is constituted by an electromagnetic lens and collimates an electron beam emitted from the crossover 3 into a collimated beam. The aperture array 11 is a mechanism that has a plurality of circular openings arranged in a matrix form and splits an electron beam incident from the collimator lens 10 into a plurality of electron beams. The first electrostatic lens 12 is an optical element that is constituted by three electrode plates (in FIG. 1, three electrode plates are shown integrally as an integral plate) each having a circular opening and focuses an electron beam to the blanking aperture 14. Both of the blanking deflector array 13 and the blanking aperture 14 are mechanisms that are arranged in a matrix form and perform the ON (non-blanking state)/OFF (blanking state) operation of the irradiation of each electron beam. In particular, the blanking aperture 14 is arranged at a position at which the first electrostatic lens 12 first forms the crossover of an electron beam. Hereinafter, the blanking deflector array 13 is simply referred to as a "blanking deflector 13", which is a unit for independently switching the ON/OFF operation of the irradiation of an electron beam in the blanking deflector array. The deflector 15 is a mechanism that deflects an image on the surface of the substrate 7, which is placed on the substrate stage 5, in the X direction. Furthermore, the second electrostatic lens 16 is an optical element that focuses an electron beam, which has passed through the blanking aperture 14, onto the substrate 7 or focuses the image of the original crossover 3 onto an electron beam detection unit 17 on the substrate stage 5 to be described below.

Figure 2:
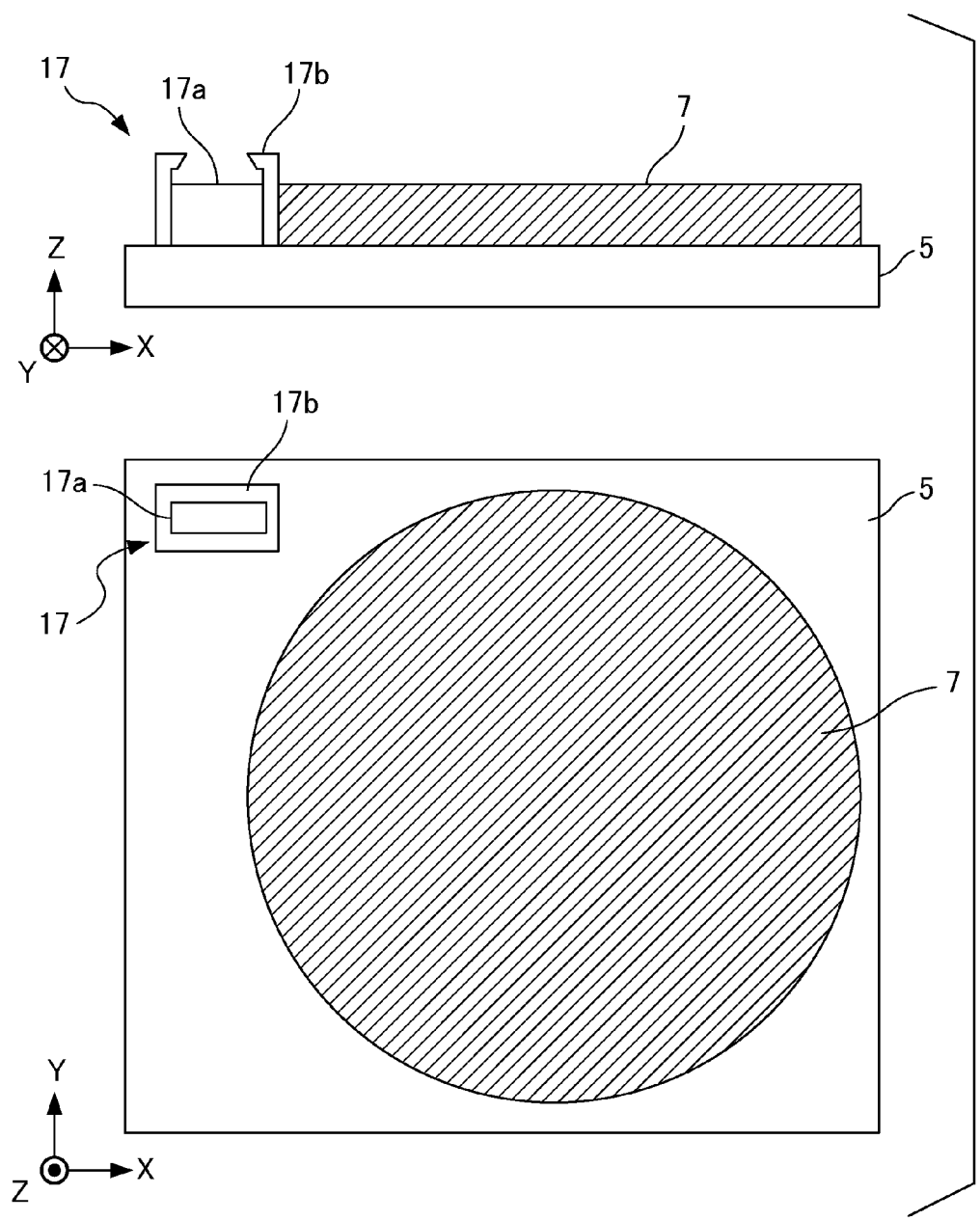
FIG. 2 is a diagram illustrating the configuration of an electron beam detection unit and the installed position thereof.

The substrate stage 5 functions as a moving body that holds the substrate 7 using, for example, electrostatic adsorption and is movable to the irradiation position of the electron beam in the XY plane. In particular, in the present embodiment, the substrate stage 5 is loaded with the electron beam detection unit 17 for detecting an electron beam in order to inspect a defect in the blanking deflector 13 as described below. FIG. 2 is a diagram illustrating the configuration of the electron beam detection unit 17 and the installed position thereof. The electron beam detection unit 17 includes an electric current detection unit (detector) 17a that detects the irradiated electron beam so as to output its current value (intensity), and a light shielding unit 17b that is disposed around the electric current detection unit 17a so as to define the number of the electron beams incident to the electric current detection unit 17a. In particular, in the present embodiment, the light shielding unit 17b has an opening width such that two electron beams can be incident to (can be detected by) the electric current detection unit 17a. Also, as shown in FIG. 2, the arrangement position of the electron beam detection unit 17 is an area at the end of the surface of the substrate stage 5 on which the substrate 7 is placed. Note that the present invention is not limited to the area, but the electron beam detection unit 17 may also be provided, for example, on a side surface of the substrate stage 5.

The controller 6 has various control circuits that control the operation of the components related to drawing with the drawing apparatus 1, and a main controller 20 that supervises the control circuits. Firstly, a first lens control circuit 21 controls the operation of the collimator lens 10 and the first electrostatic lens 12, and a second lens control circuit 22 controls the operation of the second electrostatic lens 16. A blanking control circuit 23 controls the operation of the blanking deflector 13 based on a blanking signal generated by a drawing pattern generation circuit 24, a bit map conversion circuit 25, and an energy amount command generation circuit 26. A deflection amplifier 27 controls the operation of the deflector 15 based on a deflection signal generated by a deflection signal generation circuit 28. Also, a stage control circuit 29 controls the driving of the substrate stage 5 in the X and Y directions. In particular, during pattern drawing, the stage control circuit 29 continuously scans the substrate 7 (the substrate stage 5) in the Y direction. At this time, the deflector 15 deflects an image on the surface of the substrate 7 in the X direction based on the length measurement result of the substrate stage 5 obtained by a laser length measuring machine, and the blanking deflector 13 performs the ON/OFF operation of the irradiation of the electron beam in synchrony with the timing required for drawing. Also, the controller 6 has a signal processing circuit 30 that detects a signal from the electron beam detection unit 17, and a calculation circuit 32 that calculates the exposure dose of the electron beam and determines the type of a defect concurrently with the ON/OFF control based on a signal output (signal processing circuit output) 31 of the circuit 30. The calculation circuit 32 includes a signal detection unit 33 that acquires the signal output of the irradiated electron beam, a defect judging unit 34 that judges the type of a defect in the blanking deflector 13, and an exposure dose determination unit 35 that finally determines the exposure dose of the electron beam based on the value acquired by the signal detection unit 33. Here, the types of a defect in the blanking deflector 13 are categorized into three types of a defect in the opening of the blanking deflector 13, i.e., the ON/OFF switching unit. In this case, the type of the defect is any one of a "white defect" state in which the irradiation of the electron beam is incapable of being turned OFF, a "black defect" state in which the irradiation of the electron beam is incapable of being completely turned ON, and a "gray defect" state in which the irradiation of the electron beam is capable of being turned ON only in an incomplete way. Furthermore, the controller 6 has a data storage circuit 36 that stores various data for use when the main controller 20 comprehensively executes a drawing operation, and data regarding various control circuits or the like.

Figure 3:
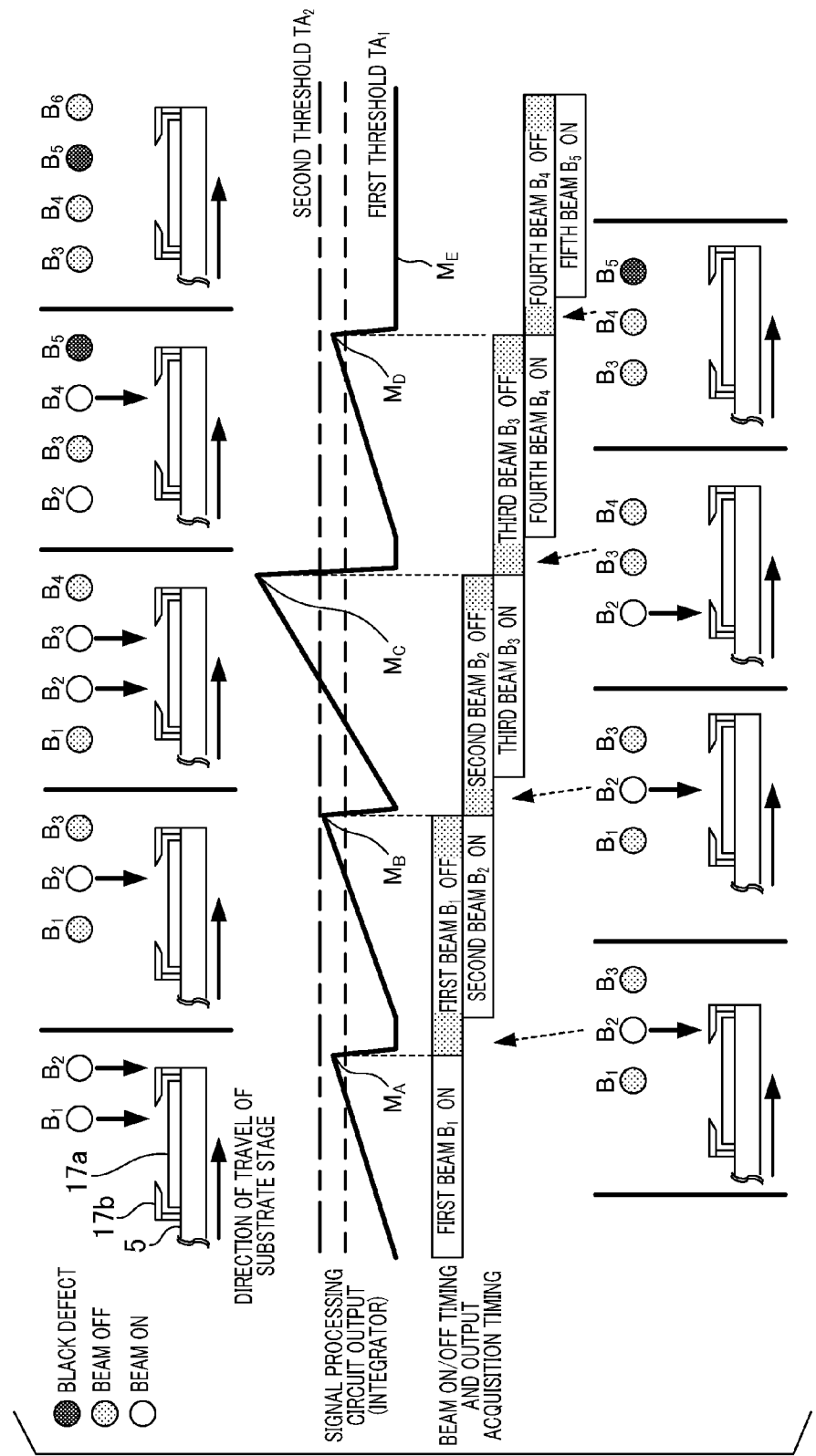
FIG. 3 is a diagram illustrating how a defect in a blanking deflector according to a first embodiment is inspected.

Next, a description will be given of the effect of the drawing apparatus 1. FIG. 3 is an explanatory diagram illustrating how a defect in the blanking deflector 13 according to the present embodiment is inspected in a time series manner. In particular, in the present embodiment, the signal processing circuit 30 is an integrator. Each of the top row and the bottom row in FIG. 3 shows the irradiation (ON/OFF) state of the specific electron beam to the electron beam detection unit 17 with respect to the movement of the substrate stage 5. The middle row in FIG. 3 shows the ON/OFF timing of an electron beam in this case, the output acquisition timing from the electric current detection unit 17a, and the output of a signal output 31 at these timing. As described above, two electron beams can be incident to the electric current detection unit 17a of the electron beam detection unit 17 at the same time. Firstly, when a defect inspection is started, the controller 6 instructs the stage control circuit 29 to perform a stepping drive of the substrate stage 5, and causes the stage control circuit 29 to move the electron beam detection unit 17 provided on the substrate stage 5 towards the area to be exposed to a first beam (first electron beam) $B_1$. Next, when the electron beam detection unit 17 reaches the irradiation area of the first beam $B_1$, that is, the first beam $B_1$ irradiation unit is positioned on the electron beam detector 17 (on the detector), the controller 6 turns the first beam $B_1$ ON using the blanking control circuit 23. Next, after an integral time T has elapsed, the controller 6 acquires the signal output 31 using the signal detection unit 33. Here, the obtained value is referred to as a "measurement result $M_A$". Next, the controller 6 turns the first beam $B_1$ OFF using the blanking control circuit 23, and subsequently discharges the signal processing circuit 30 while the substrate stage 5 performs a stepping drive. After completion of discharge, the controller 6 starts charging. Next, when the electron beam detection unit 17 reaches the irradiation area of the other second beam (second electron beam: the electron beam positioned next to the first beam $B_1$) $B_2$, the controller 6 turns the second beam $B_2$ ON using the blanking control circuit 23. Next, after the integral time T has elapsed, the controller 6 acquires the signal output 31 using the signal detection unit 33. Here, the obtained value is referred to as a "measurement result $M_B$". Next, the controller 6 turns the second beam $B_2$ OFF using the blanking control circuit 23, and subsequently discharges the signal processing circuit 30 while the substrate stage 5 performs a stepping drive. After completion of discharge, the controller 6 starts charging. Then, the controller 6 repeats the same processing as described above for the electron beams subsequent to a third beam (third electron beam) $B_3$ positioned next to the second beam $B_2$.

Next, the controller 6 judges the type of a defect in the blanking deflector 13 using the defect judging unit 34 based on the measurement result $M_A$ and the measurement result $M_B$ described above, that is, the measurement result for an electron beam and the measurement result for an electron beam positioned next to the electron beam. For example, the defect judging unit 34 sets two threshold values determined with reference to a beam current estimated from a pre-calculated value, a previously measured value, or the like, that is, a first threshold value $TA_1$ serving as a lower limit value and a second threshold value $TA_2$ serving as an upper limit value. In this case, the defect judging unit 34 repeatedly executes judgment taking into account the following conditions (1) to (8):

(1) when the measurement result $M_A$ is equal to or lower than the first threshold value $TA_1$, the opening (switching unit) of the first beam $B_1$ in the blanking deflector 13 is in a "gray defect" state or a "black defect" state;

(2) when the measurement result $M_A$ falls between the first threshold value $TA_1$ and the second threshold value $TA_2$, the opening of the first beam $B_1$ is in a "normal" state or a "white defect" state;

(3) when the measurement result $M_A$ lies in the condition (2) and the measurement result $M_B$ falls between the first threshold value $TA_1$ and the second threshold value $TA_2$ or is equal to or lower than the first threshold value $TA_1$, the opening of the first beam $B_1$ is in a "normal" state;

(4) when the measurement result $M_A$ lies in the condition (2) and the measurement result $M_B$ is equal to or greater than the second threshold value $TA_2$, the opening of the first beam $B_1$ is in a "white defect" state;

(5) when the measurement result $M_B$ is equal to or lower than the first threshold value $TA_1$, the opening of the second beam $B_2$ is in a "gray defect" state or a "black defect" state;

(6) when the measurement result $M_B$ is equal to or greater than the first threshold value $TA_1$, the opening of the second beam $B_2$ is in a "normal" state or a "white defect" state. When the opening of the first beam $B_1$ is in a "white defect" state, the measurement result $M_B$ is, essentially, equal to or greater than the first threshold value $TA_1$;

(7) when the measurement result $M_B$ lies in the condition (6) and the measurement result $M_C$ (a signal output relating to a third beam $B_3$ positioned adjacent to the second beam $B_2$) falls between the first threshold value $TA_1$ and the second threshold value $TA_2$ or is equal to or lower than the first threshold value $TA_1$, the opening of the second beam $B_2$ is in a "normal" state; and (8) when the measurement result $M_B$ lies in the condition (6) and the measurement result $M_C$ is equal to or greater than the second threshold value $TA_2$, the opening of the second beam $B_2$ is in a "white defect" state.

Here, consider the case in which the output value (measurement result) of the signal output 31 acquired by the signal detection unit 33 has the tendency as shown in FIG. 3. Firstly, in the first beam $B_1$, the opening of the first beam $B_1$ is determined to be in a "normal" state from the condition (3). Hence, the individual exposure dose of the first beam $B_1$ and the second beam $B_2$ is properly measured. Accordingly, the controller 6 stores the output value of the signal output 31 in this case in the data storage circuit 36. Next, the defect judging unit 34 judges from the condition (8) that the opening of the second beam $B_2$ is in a "white defect" state. Here, since the opening of the second beam $B_2$ is in a "white defect" state, the measurement result $M_C$ is a sum of the output value of the second beam $B_2$ and the output value of the third beam $B_3$. In this case, the exposure dose of the single third beam $B_3$ can be determined by subtracting the measurement result $M_B$ from the measurement result $M_C$ using the exposure dose determination unit 35. Next, the defect judging unit 34 judges from the condition (3) (or condition (7)) that the opening of a fourth beam $B_4$ is in a "normal" state while taking into account the exposure dose of the third beam $B_3$ determined by the exposure dose determination unit 35. Furthermore, since the measurement result $M_E$ is equal to or lower than the first threshold value $TA_1$, the defect judging unit 34 judges from the condition (1) (or condition (5)) that the opening of a fifth beam $B_5$ is in a "gray defect" state or a "black defect" state. Here, whether a defect is either a "gray defect" or a "black defect" may be judged by the fact that the exposure dose determination unit 35 calculates the exposure dose of an electron beam based on the value of the measurement result at that time and the defect judging unit 34 compares the exposure dose with that of the other electron beam to be irradiated normally.

Figure 4:
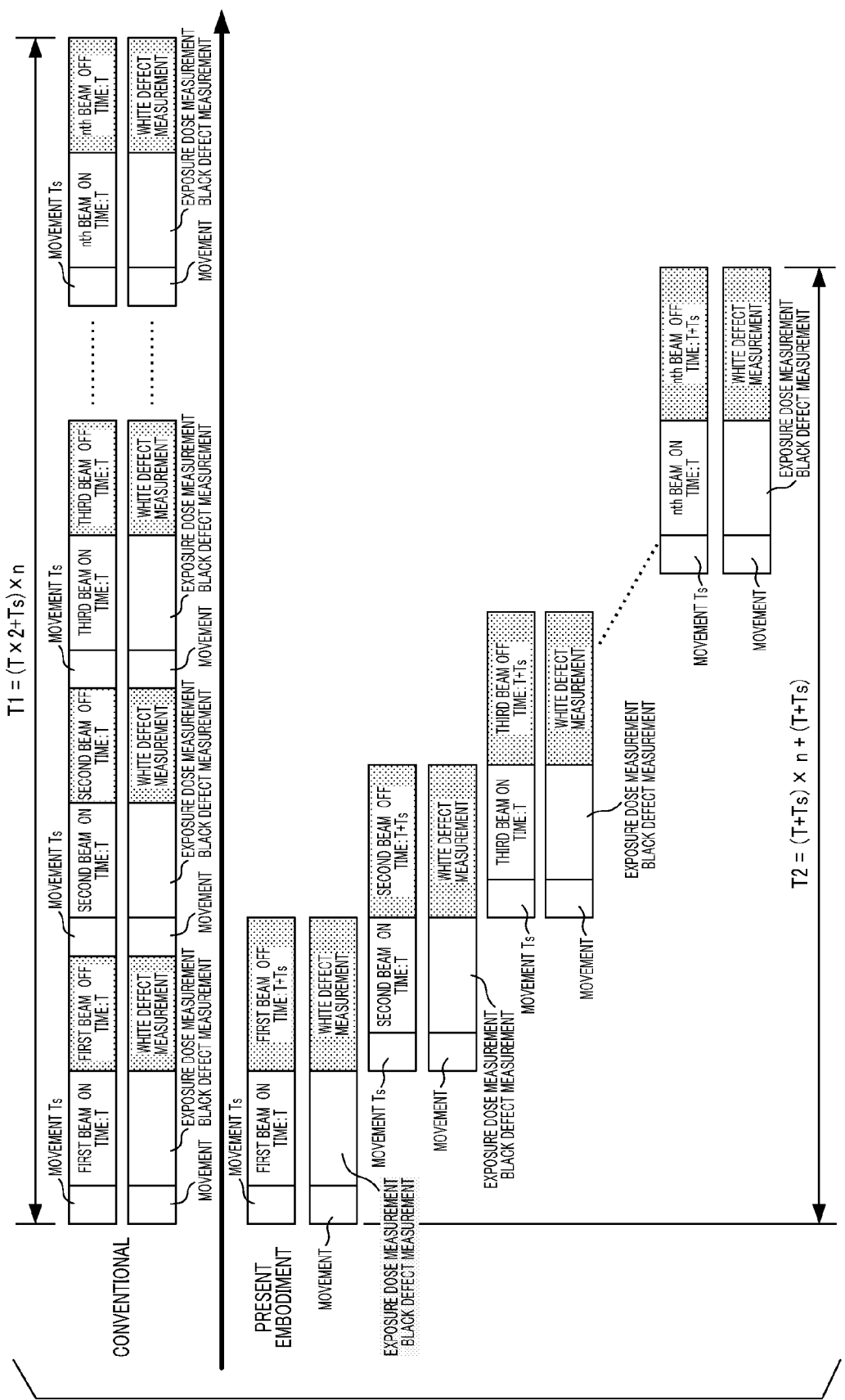
FIG. 4 is a diagram comparing the conventional defect inspection method to the defect inspection method of the present embodiment.

Next, as a reference, the time (total measurement time), which includes the measurement of the exposure dose of an electron beam, taken to detect a defect in the blanking deflector 13 using the drawing apparatus 1 of the present embodiment is compared with the total measurement time using the conventional drawing apparatus. FIG. 4 is a diagram illustrating the total measurement time using the drawing apparatus 1 with respect to the total measurement time using the conventional drawing apparatus. Firstly, in the conventional drawing apparatus, a control unit executes integration processing (time T) as exposure dose measurement and black defect measurement. Next, the blanking deflector executes integration processing (time T) with an electron beam being turned OFF, and confirms that the irradiation output is not detected (white defect measurement). Then, a series of operations in which the substrate stage performs a stepping drive to the next electron beam irradiation area (time $T_S$) are repeated. At this time, given that the total number of electron beams is "n", the total measurement time T1 required for executing all of exposure dose measurement and defect detection is represented by the following Formula (1).

$$T1 = (T \times 2 + T_S) \times n \quad (1)$$

In contrast, in the drawing apparatus 1 of the present embodiment, exposure dose measurement and defect detection are executed by alternately turning the irradiation of adjacent electron beams ON/OFF using the electron beam detection unit 17 having a width that allows two electron beams to be emitted at the same time. In other words, the drawing apparatus 1 executes the exposure dose measurement and the black defect detection of the nth beam $B_n$ and the white defect detection of the (n+1)th beam $B_{n+1}$ in a simultaneous manner. At this time, the total measurement time T2 required for executing all of exposure dose measurement and defect detection is represented by the following Formula (2).

$$T2 = (T + T_S) \times n + (T + T_S) \quad (2)$$

Therefore, the total measurement time T2 using the drawing apparatus 1 can be reduced by the time of $T \times n - (T + T_S)$ min obtained from Formula (1)-Formula (2) as compared with the total measurement time T1 using the conventional drawing apparatus. In particular, when the total number "n" of electron beams becomes large, a greater effect may be expected.

As described above, according to the present embodiment, a drawing apparatus that is advantageous for having a shorter defect inspection time for the blanking deflector array 13 may be provided.

Second Embodiment

Next, a description will be given of a drawing apparatus according to a second embodiment of the present invention. The configuration of the drawing apparatus of the present embodiment is the same as that described in the first embodiment. Hereinafter, the same components as those in the drawing apparatus 1 shown in FIG. 1 are designated by the same reference numerals and explanation thereof will be omitted. In general, it is often the case that a defect in the blanking deflector 13 as described above is a defect in a beam group, for example, a white defect or a black defect in two adjacent electron beams, occurring in a plurality of electron beams, each having an opening that allows the ON/OFF operation to be performed in a normal state. In this case, the controller 6 can detect a defect as shown in the first embodiment accurately irrespective of the type of defect. In contrast, it may be considered that a white defect and a black defect infrequently occur alternately in a plurality of openings of the blanking deflector 13. Thus, the drawing apparatus of the present embodiment performs defect detection so as to be compatible with the case in which a white defect and a black defect may occur alternately.

Figure 5:
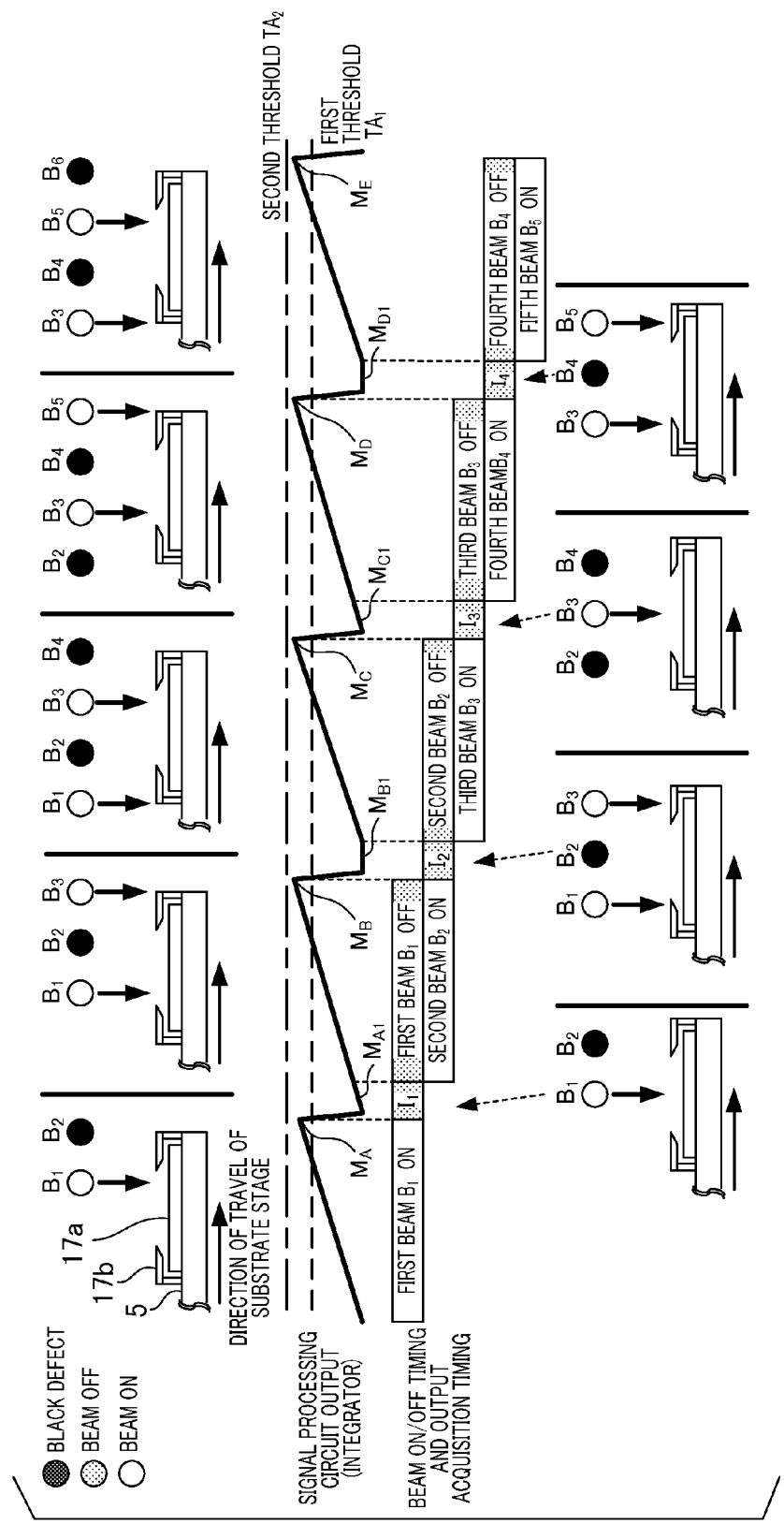
FIG. 5 is a diagram illustrating how a defect in a blanking deflector according to a second embodiment is inspected.

FIG. 5 is an explanatory diagram, which corresponds to FIG. 3 according to the first embodiment, illustrating how a defect in the blanking deflector 13 according to the present embodiment is inspected in a time series manner. In the present embodiment, the signal processing circuit 30 is an integrator. Also, the controller 6 basically executes the same sequence as in the first embodiment described with reference to FIG. 3. However, in the present embodiment, the controller 6 provides a fixed interval I using the blanking control circuit 23 from the time point when the irradiation of an electron beam is turned from ON to OFF to the time point when the irradiation of an electron beam positioned next to the electron beam is turned ON. Here, consider the case in which the output value of the signal output 31 acquired by the signal detection unit 33 has the tendency as shown in FIG. 5. Firstly, the measurement result $M_A$ for the first beam $B_1$ falls between the first threshold value $TA_1$ and the second threshold value $TA_2$, and the measurement result $M_B$ for the second beam $B_2$ is equal to or greater than zero. At this time, if the opening (for switching irradiation) for driving the first beam $B_1$ is in a normal state, the electron beam must be turned OFF in a section $I_1$ to acquire the measurement result $M_{A1}$ on the sequence, and thus, the measurement result $M_{A1}$ must be zero.

However, as shown in FIG. 5, when the opening for driving the first beam $B_1$ is in a white defect state, an electron beam, which must be turned OFF, continues to be turned ON. Thus, since the controller 6 starts charging using the first beam $B_1$ immediately after completion of discharge, the measurement result $M_{A1}$ is not zero. In other words, since the measurement result $M_B$ is equal to or greater than zero and the measurement result $M_C$ for the third beam $B_3$ falls between the first threshold value $TA_1$ and the second threshold value $TA_2$, the defect judging unit 34 judges that the opening for driving the first beam $B_1$ is in a "white defect" state and the opening for driving the second beam $B_2$ is in a "black defect" state. As described above, according to the present embodiment, the same effects as those in the first embodiment may be provided even when a white defect and a black defect alternately occur in a plurality of openings of the blanking deflector 13.

Third Embodiment

Next, a description will be given of a drawing apparatus according to a third embodiment of the present invention. Some of the conventional multiple beam-type drawing apparatuses include a movable shutter having an opening for selectively passing an electron beam therethrough on the path of the electron beam. In the drawing apparatus, only the normal electron beams, which have selectively passed through the opening of the movable shutter, are employed, and thus, a reduction in the drawing processing speed may be suppressed as much as possible. In other words, instead of defining one beam as a detection unit for abnormal electron beams using the application, it is also effective to vary the drawing apparatus so as to detect abnormal electron beams present in a block (group) for a certain number beams as a unit. Accordingly, the drawing apparatus of the present embodiment irradiates a beam group including a plurality of electron beams at the same time so as to perform defect detection.

Figure 6:
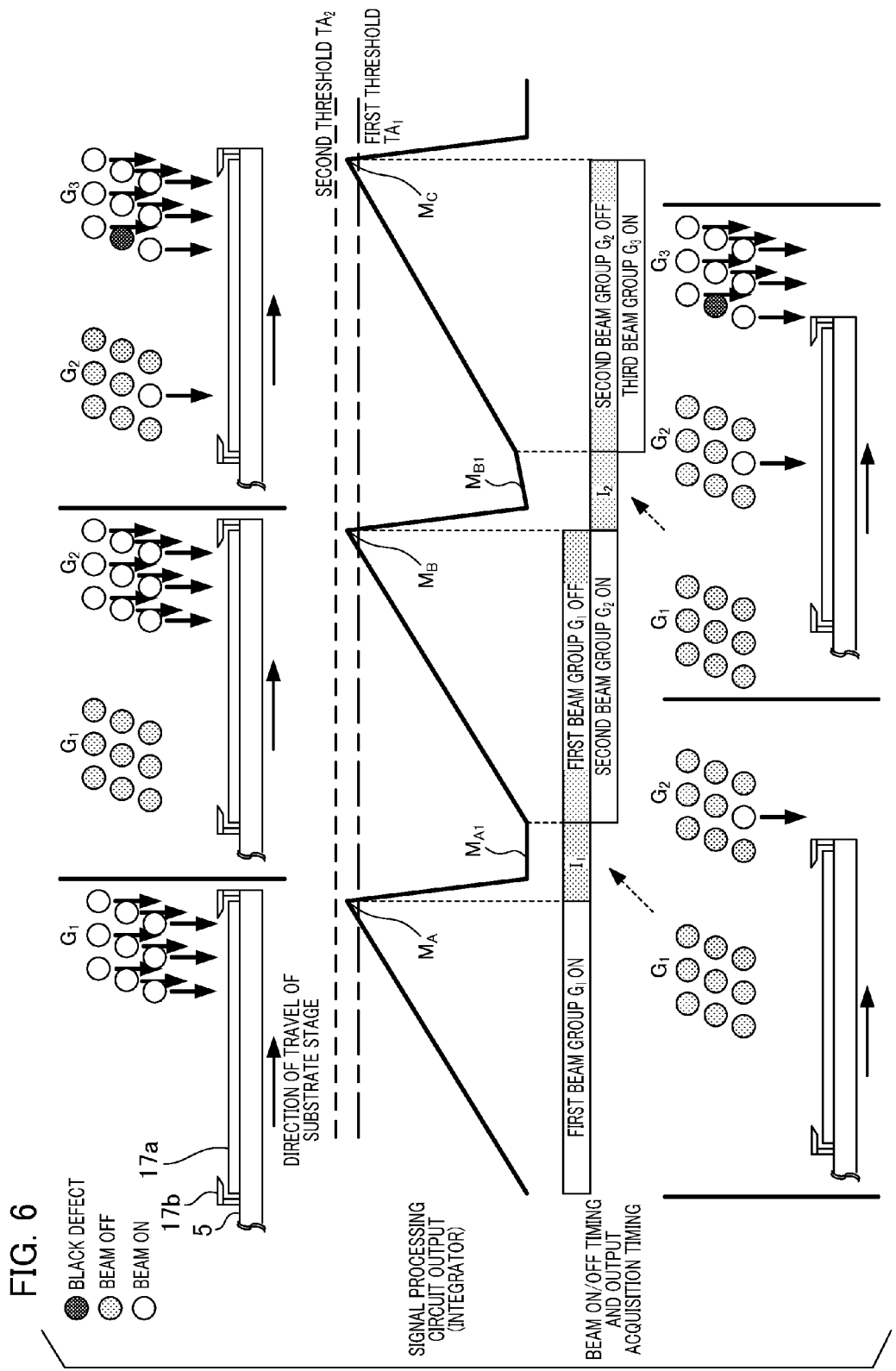
FIG. 6 is a diagram illustrating how a defect in a blanking deflector according to a third embodiment is inspected.

FIG. 6 is an explanatory diagram, which corresponds to FIG. 5 according to the second embodiment, illustrating how a defect in the blanking deflector 13 according to the present embodiment is inspected in a time series manner. In the present embodiment, the signal processing circuit 30 is an integrator. Also, two electron beams can be incident to the electric current detection unit 17a at the same time. In this case, the controller 6 basically executes the same sequence as in the second embodiment described with reference to FIG. 5. Here, consider the case in which the output value of the signal output 31 acquired by the signal detection unit 33 has the tendency as shown in FIG. 6. Firstly, the controller 6 acquires the signal output 31 (the measurement result $M_A$) for a first beam group $G_1$ having all normal openings by means of the signal detection unit 33. At this time, if all openings for driving a second beam group $G_2$ are in a normal state, all of the electron beams must be turned OFF in a section $I_2$ to acquire the measurement result $M_{B1}$ on the sequence, and thus, the measurement result $M_{B1}$ must be zero. However, if any one of a plurality of openings for driving the second beam group $G_2$ is in a "white defect" state, a certain value occurs in a beam group to be turned OFF. Likewise, since the measurement result $M_C$ relating to a third beam group $G_3$ falls between the first threshold value $TA_1$ and the second threshold value $TA_2$, the defect judging unit 34 can judge that any one of a plurality of openings for driving the third beam group $G_3$ is in a "black defect" state by comparing the measurement result $M_C$ with the measurement result $M_B$. In this manner, according to the present embodiment, the blanking deflector 13 is irradiated with a beam group including a plurality of electron beams at the same time to thereby perform defect detection, and thus, an abnormal electron beam(s) present in a beam group can be detected at high speed. It is desirable that the number of electron beams included in a beam group and the measurement resolution of the electric current detection unit 17a be determined based on the noise of a measurement system or the like. Also, it is desirable that two threshold values $TA_1$ and $TA_2$ in this case be determined taking into account the number of electron beams included in a beam group in addition to a beam current estimated from the calculated value, a previously measured value, or the like as described above.

Fourth Embodiment

Figure 7:
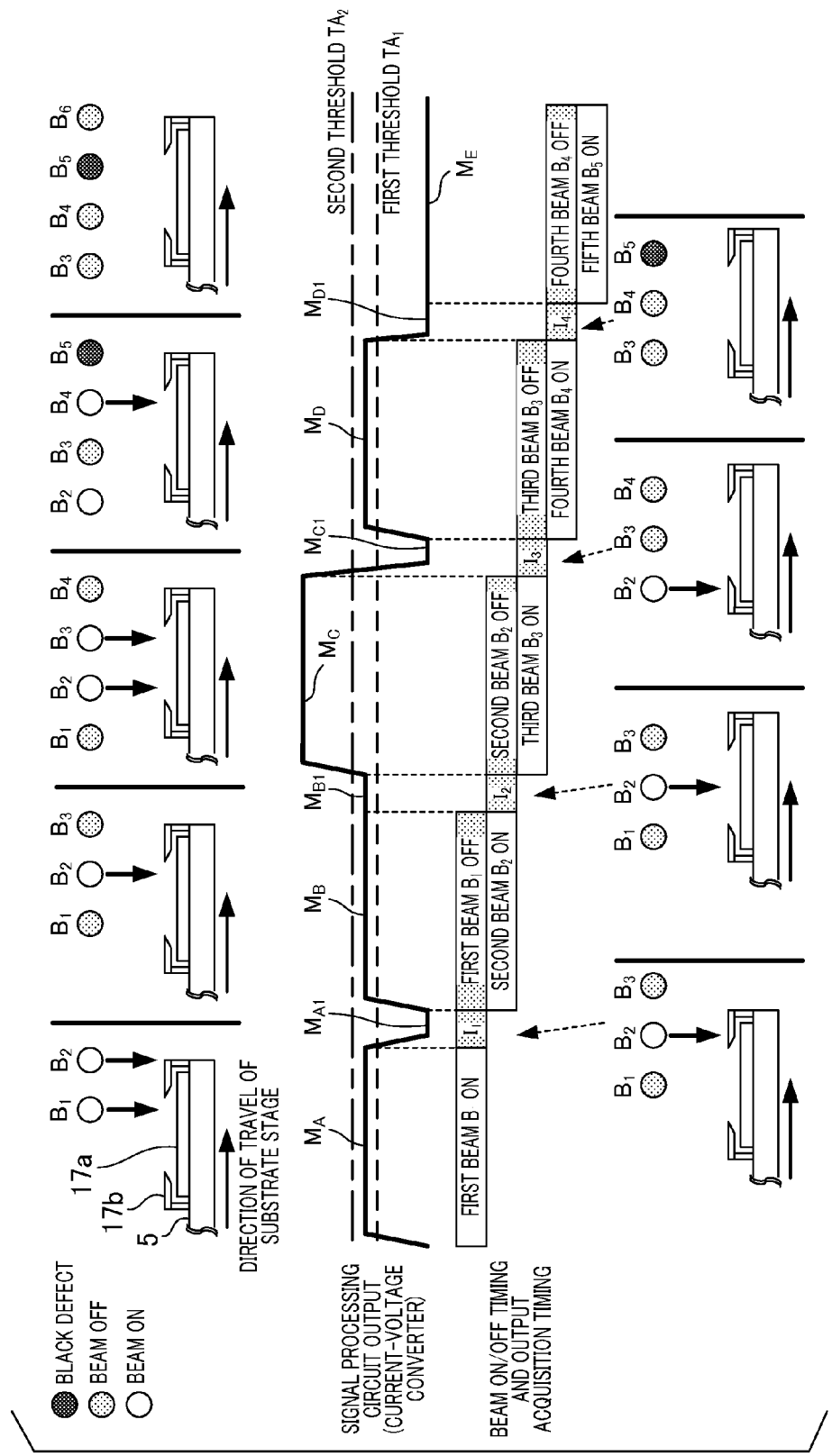
FIG. 7 is a diagram illustrating how a defect in a blanking deflector according to a fourth embodiment is inspected.

Next, a description will be given of a drawing apparatus according to a fourth embodiment of the present invention. A feature of the drawing apparatus of the present embodiment is that the controller 6 executes the exposure dose measurement of an electron beam using the output of an integrator, whereas the controller 6 executes the defect detection of the blanking deflector 13 using the output of a current-voltage converter. In particular, the signal output 31 from the signal processing circuit 30 according to the present embodiment is the output of a current-voltage converter. FIG. 7 is an explanatory diagram, which corresponds to FIG. 3 according to the first embodiment, illustrating how a defect in the blanking deflector 13 according to the present embodiment is inspected in a time series manner. In this case, the controller 6 executes the same sequence as in the first embodiment described with reference to FIG. 3. In the sequence, when the opening for driving the first beam $B_1$ is in a normal state, the measurement result $M_A$ falls between the first threshold value $TA_1$ and the second threshold value $TA_2$, and the electron beam is turned OFF in the interval $I_1$ on the sequence, and thus, the measurement result $M_{A1}$ is zero. On the other hand, the measurement result $M_B$ falls between the first threshold value $TA_1$ and the second threshold value $TA_2$, and the value of the measurement result $M_B$ is the same as that of the measurement result $M_{B1}$ in the interval $I_2$. Also, when considering the fact that the measurement result $M_C$ is equal to or greater than the second threshold value $TA_2$, the defect judging unit 34 can judge that the second beam $B_1$ is in a "white defect" state. Likewise, since the measurement result $M_E$ is equal to or lower than the first threshold value $TA_1$, the defect judging unit 34 can judge that the fifth beam $B_5$ is in a "black defect" state.

Figure 8:
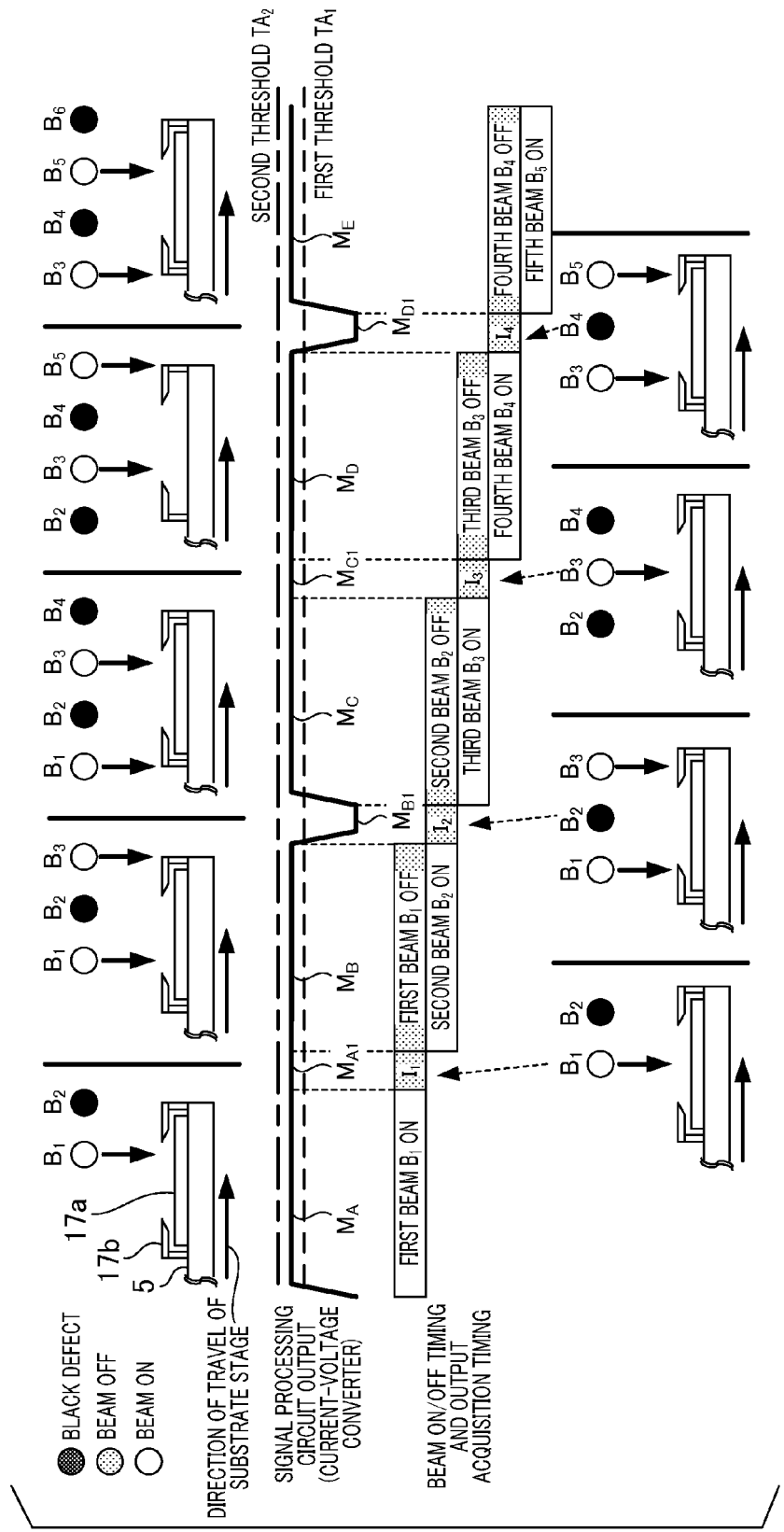
FIG. 8 is a diagram illustrating how a defect in a blanking deflector according to a fourth embodiment is inspected.

FIG. 8 is an explanatory diagram, which corresponds to FIG. 5 according to the second embodiment, illustrating how a defect in the blanking deflector 13 according to the present embodiment is inspected in a time series manner. In this case, the controller 6 executes the same sequence as in the second embodiment described with reference to FIG. 5. In the sequence, the measurement result $M_A$ falls between the first threshold value $TA_1$ and the second threshold value $TA_2$. Here, when the opening for driving the first beam $B_1$ is in a normal state, the electron beam is turned OFF in the interval $I_1$ on the sequence, and thus, the measurement result $M_{A1}$ is zero. However, when the opening for driving the first beam $B_1$ is in a white defect state, the first beam $B_1$, which must be turned OFF, continues to be turned ON. Thus, the measurement result $M_{A1}$ is not zero. Since the measurement result $M_{A1}$ is equal to or greater than zero and the measurement result $M_B$ falls between the first threshold value $TA_1$ and the second threshold value $TA_2$, the defect judging unit 34 can judge that the opening for driving the first beam $B_1$ is in a "white defect" state and the opening for driving the second beam $B_2$ is in a "black defect" state. In this manner, according to the present embodiment, the same effects as those in the aforementioned embodiment may be provided even when the controller 6 executes defect detection of the blanking deflector 13 using the output of the current-voltage converter.

Fifth Embodiment

Figure 9A:
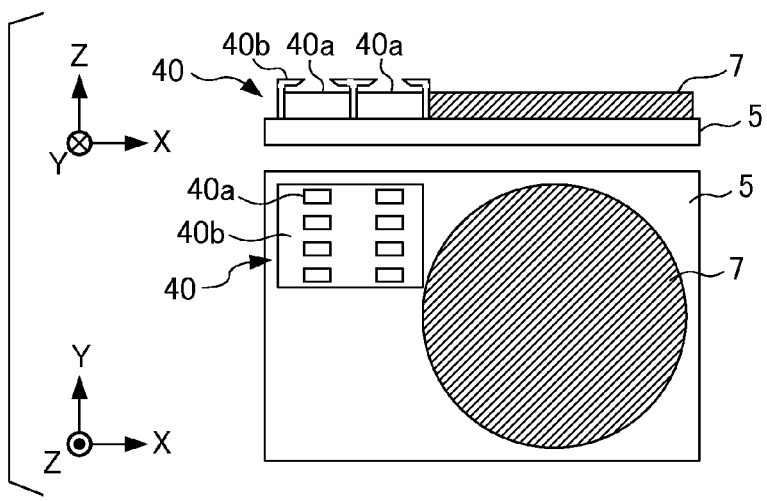
FIG. 9A is a diagram illustrating the configuration of an electron beam detection unit according to a fifth embodiment.
Figure 9B:
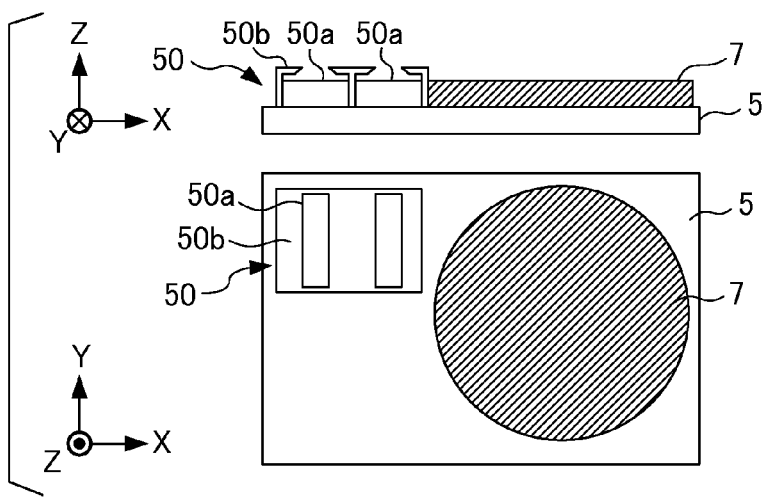
FIG. 9B is a diagram illustrating the configuration of a variant example of the electron beam detection unit according to the fifth embodiment.
Figure 9C:
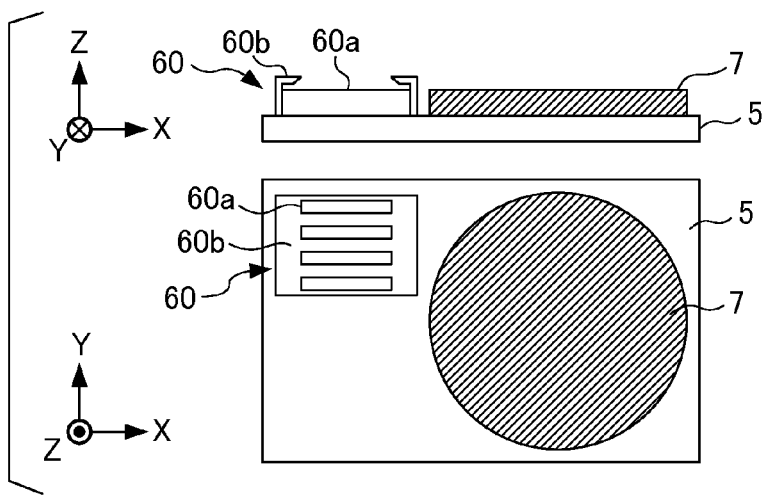
FIG. 9C is a diagram illustrating the configuration of another variant example of the electron beam detection unit according to the fifth embodiment.

Next, a description will be given of a drawing apparatus according to a fifth embodiment of the present invention. A feature of the present embodiment is that the shape of the electric current detection unit 17a and the light shielding unit 17b in the electron beam detection unit 17 of the above embodiment is changed. Each of FIGS. 9A to 9C is a diagram illustrating the configuration of the electron beam detection unit according to the present embodiment, which corresponds to the configuration shown in FIG. 2 according to the above embodiment, and its installed position. In particular, FIG. 9A shows the case in which an electron beam detection unit 40 provided on the substrate stage 5 is provided with a plurality of electric current detection units 40a. For example, in FIG. 9A, eight electric current detection units 40a in total are arranged in two rows in the direction of travel (X direction) of the substrate stage 5 and in four rows in the Y direction. In this case, as in the above embodiment, the number of electron beams incident to the electric current detection units 40a is defined by a light shielding unit 40b. In contrast, FIG. 9B is a diagram illustrating an electron beam detection unit 50 in which an electric current detection unit 50a is arranged in two rows in the direction of travel of the substrate stage 5. Furthermore, FIG. 9C is a diagram illustrating an electron beam detection unit 60 in which an electric current detection unit 60a is arranged in four rows in the Y direction. The drawing apparatus of the present embodiment has signal processing circuits respectively corresponding to a plurality of electric current detection units in the electron beam detection unit, and the controller 6 executes processing as in the embodiment in parallel. With this arrangement, the drawing apparatus of the present embodiment can detect the position and the type of a defect in the blanking deflector 13 at higher speed.

While, in the first and the second embodiments, the electron beam detection unit 17 is configured such that two electron beams can be incident to the electric current detection unit 17a at the same time, the present invention is not limited thereto. The drawing apparatus of the present invention can perform exposure dose measurement and defect detection by applying the same procedure as for the first and the second embodiments even when three or more electron beams can be incident by means of, for example, the light shielding unit 17b of the electron beam detection unit 17. In this case, the controller 6 judges a defect in at least one electron beam when the electron beam detection unit 17 is positioned at an area to be irradiated by three electron beams. Also, if the controller 6 sequentially executes defect detection thereafter, a defect in two electron beams may substantially be detected since a defect in at least one out of three electron beams has already been judged.

Furthermore, in the embodiment, the substrate stage 5 is driven in a stepping drive. However, the substrate stage 5 may be driven at constant velocity that meets, for example, integral time and charging/discharging time.

Article Manufacturing Method

An article manufacturing method according to an embodiment of the present invention is preferred in, for example, manufacturing a micro device such as a semiconductor device or the like or an article such as an element or the like having a microstructure. The article manufacturing method may include the steps of forming, in a latent image pattern step, a latent image pattern on a substrate on which a photosensitizing agent is coated using the aforementioned drawing apparatus; and developing the substrate on which the latent image pattern has been formed in the latent image pattern step. Furthermore, the article manufacturing method may include other known steps (oxidizing, film forming, vapor depositing, doping, flattening, etching, resist peeling, dicing, bonding, packaging, and the like). The article manufacturing method of the present embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-258550 filed Nov. 19, 2010 which is hereby incorporated by reference herein in its entirety.

What is claimed is:

1. A drawing apparatus that comprises a blanking deflector array and performs drawing on a substrate with a plurality of charged particle beams passed through the blanking deflector array, the apparatus comprising:
   a detector having a size for which the detector can simultaneously detect two adjacent charged particle beams among the plurality of charged particle beams, and configured to detect an intensity of a charged particle beam incident thereon; and
   a controller,
   wherein the controller is configured to perform a control of a position of the detector and a control of the blanking deflector array such that one of two adjacent charged particle beams is in a blanking state and the other is in a non-blanking state on the detector that is moved, and each of the plurality of charged particle beams becomes in a blanking state and a non-blanking state sequentially on the detector that is moved, to cause the detector to perform an output in parallel with the controls, and to inspect a defect in each blanking deflector in the blanking deflector array based on the output.

2. The apparatus according to claim 1, wherein the controller is configured to control the blanking deflector array such that a first switching from a non-blanking state to a blanking state of a charged particle beam, which is firstly positioned on the detector, of the two adjacent charged particle beams is performed prior to a second switching from a blanking state to a non-blanking state of a charged particle beam, which is secondly positioned on the detector, of the two adjacent charged particle beams, and to cause the detector to perform an output in a period between the first switching and the second switching.

3. The apparatus according to claim 1, wherein each of the two adjacent charged particle beams is a charged particle beam group including a plurality of charged particle beams, and
   wherein the controller is configured to inspect whether a blanking deflector group corresponding to the charged particle beam group includes a blanking deflector with a defect.

4. The apparatus according to claim 1, wherein the controller comprises an integrator that integrates the output of the detector, and is configured to inspect the defect based on an output of the integrator.

5. The apparatus according to claim 1, wherein the controller comprises a current-voltage converter that performs a current-voltage conversion of the output of the detector, and is configured to inspect the defect based on an output of the current-voltage converter.

6. The apparatus according to claim 1, wherein the apparatus comprises a plurality of the detector, and wherein the controller is configured to cause the plurality of the detector to operate in parallel, and to inspect a defect in each blanking deflector in the blanking deflector array.

7. The apparatus according to claim 1, wherein the controller is configured to inspect, as the defect, at least one of a white defect, a black defect, and a gray defect.

8. A method of manufacturing an article, the method comprising:

performing drawing on a substrate using a drawing apparatus that includes a blanking deflector array and performs drawing on a substrate with a plurality of charged particle beams passed through the blanking deflector array, wherein the drawing apparatus comprises: a detector having a size for which the detector can simultaneously detect two adjacent charged particle beams among the plurality of charged particle beams, and configured to detect an intensity of a charged particle beam incident thereon; and a controller, wherein the controller is configured to perform a control of a position of the detector and a control of the blanking deflector array such that one of two adjacent charged particle beams is in a blanking state and the other is in a non-blanking state on the detector that is moved, and each of the plurality of charged particle beams becomes in a blanking state and a non-blanking state sequentially, to cause the detector to perform an output in parallel with the control, and to inspect a defect in each blanking deflector in the blanking deflector array based on the output;

developing the substrate on which the drawing has been performed; and processing the developed substrate to manufacture the article.

* * * * *